United States Patent [19]

Kobayashi

[11] Patent Number: 5,422,315
[45] Date of Patent: Jun. 6, 1995

[54] METHOD FOR FORMING SELF-ALIGNED CONTACT HOLE AND SEMICONDUCTOR DEVICE HAVING SELF-ALIGNED CONTACT HOLE

[75] Inventor: Migaku Kobayashi, Tokyo, Japan

[73] Assignee: NEC Corporation, Japan

[21] Appl. No.: 204,899

[22] Filed: Mar. 2, 1994

Related U.S. Application Data

[63] Continuation of Ser. No. 722,875, Jun. 28, 1991, abandoned.

[30] Foreign Application Priority Data

Jun. 28, 1990 [JP] Japan .................................. 2-172313

[51] Int. Cl.⁶ .................. H01L 21/265; H01L 21/465; H01L 29/78
[52] U.S. Cl. ........................ 437/228; 437/43; 437/49; 437/235; 437/919; 257/296
[58] Field of Search .................. 357/23.6; 257/228; 437/43, 49, 228, 235, 919

[56] References Cited

U.S. PATENT DOCUMENTS 5,091,761 2/1992 Hiraiwa et al. .................. 357/23.6

*Primary Examiner*—Edward Wojciechowicz
*Attorney, Agent, or Firm*—Laff, Whitesel, Conte & Saret, Ltd.

[57] ABSTRACT

In a semiconductor device that includes a first level conductor layer, a second level conductor layer, and a third level conductor layer, the second level conductor layer being positioned at a level between the first and third level conductor layers, a contact hole for electrically connecting the first and third conductor layers is formed in a self-aligned manner, by utilizing an insulating layer which is formed to cover the second level conductor layer in such a manner that the insulator layer surrounds or confines an area where the contact hole is to be formed.

5 Claims, 6 Drawing Sheets

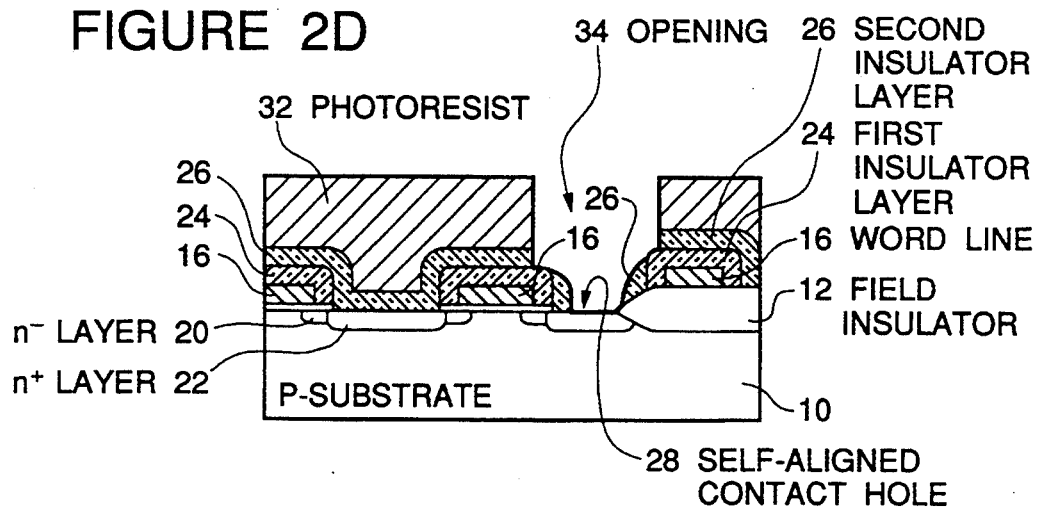
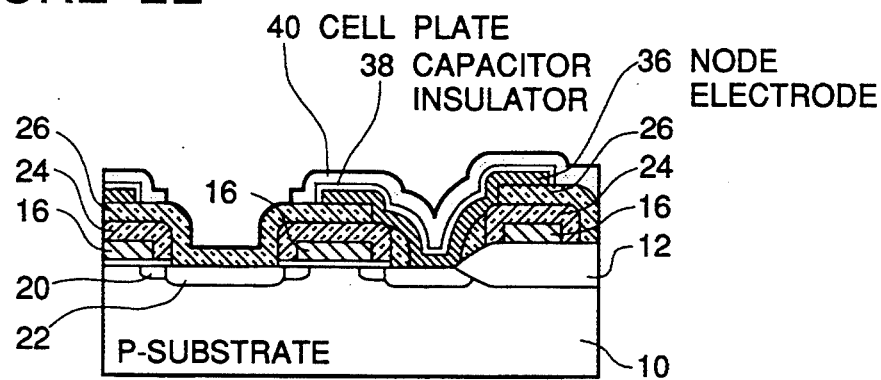
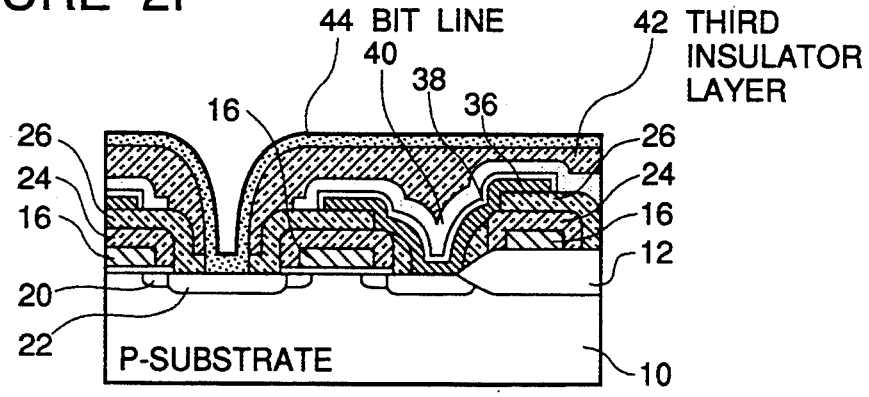

METHOD FOR FORMING SELF-ALIGNED CONTACT HOLE AND SEMICONDUCTOR DEVICE HAVING SELF-ALIGNED CONTACT HOLE

This application is a continuation of application Ser. No. 07/722,875, filed Jun. 28, 1991, now abandoned.

BACKGROUND OF THE INVENTION

1. Field of the Invention

The present invention relates to a method for forming a self-aligned contact hole and a semiconductor device having a self-aligned contact hole.

2. Description of Related Art

In conventional semiconductor devices, a number of contact holes have been formed in a self-aligned manner by utilizing a pattern of an isolating field insulator layer. In DRAMs (dynamic random access memory) of a stacked capacitor one-transistor type, for example, the contact holes have been formed in the self-aligned manner by utilizing an isolating field insulator layer and insulator layers that are formed on an upper surface and a side wall surface of a word line. However, this self-aligned contact hole forming method has been disadvantageous in the following points:

First, for formation of self-aligned contact holes, the isolating field insulator layer had to be formed to have a sectional view configuration or shape that has small bird's beaks and steep steps at edges of an isolating field insulator layer pattern. In addition, the isolating field insulator layer had to have a thickness which larger than that which is necessary and sufficient for an inherent device isolation. This becomes a direct cause that greatly lowers working precision of photoresist patternings and etchings in succeeding photolithographic processes.

In addition, since it is necessary to previously form the insulator layer on the upper surface of the word line, a step formed by the word line has inevitably become large. Here, for example, assume that a thickness of the word line is 0.3 μm, the thickness of the insulator layer formed on the upper surface of the word line is 0.2 μm, and the thickness of the insulator layer formed on the side wall surface of the word line is 0.2 μm. In this case, assuming that a spacing between each pair of adjacent word lines is 0.7 μm in a mask layout pattern, a slit-like concave or groove having a width of 0.3 μm and a depth of 0.5 μm will be formed. This makes the photoresist patternings and the etchings in succeeding photolithographic processes very difficult As mentioned above, if the self-aligned contact holes are formed in the prior art method as mentioned above, the step of the underlying pattern is very large, and the working precision of the succeeding photolithographic processes is remarkable decreased. As a result, the prior an method of the self-aligned contact hole formation could be hardly used in practice.

In addition, since the isolating field insulator layer is utilized for formation of the self-aligned contact holes, the prior art method could be applied to only formation of the self-aligned contact holes on a silicon substrate.

SUMMARY OF THE INVENTION

Accordingly, it is an object of the present invention to provide a self-aligned contact hole formation method which has overcome the above mentioned defect of the conventional one.

Another object of the present invention is to provide a self-aligned contact hole formation method which can minimize the thickness of the isolating field insulator layer so that a step of an underlying layer can be made as small as possible, and therefore, the working precision of photoresist patternings and etchings in succeeding photolithographic processes can be prevented from being decreased.

Still another object of the present invention is to provide a semiconductor device having self-aligned contact holes capable of allowing to minimize the thickness of the isolating field insulator layer.

The above and other objects of the present invention are achieved in accordance with the present invention by a method for forming a self-aligned contact hole in a semiconductor device that includes a first level conductor layer, a second level conductor layer, and a third level conductor layer, the second level conductor layer being positioned at a level between the first and third level conductor layers. The method is characterized by including the steps of forming an insulating layer to cover the second level conductor layer in such a manner that the insulator layer surrounds or confines an area where a contact hole is to be formed for electric connection between the first and third level conductor layers, and forming, in a self-aligned manner, a contact hole in the area surrounded by the insulating layer.

According to another aspect of the present invention, there is provided a semiconductor device that includes a first level conductor layer, a second level conductor layer, and a third level conductor layer, the second level conductor layer being positioned at a level between the first and third level conductor layers. In this semiconductor device, a contact hole for electric connection between the first and third level conductor layers is surrounded by an insulating layer coveting the second level conductor layer.

The above and other objects, features and advantages of the present invention will be apparent from the following description of preferred embodiments of the invention with reference to the accompanying drawings.

BRIEF DESCRIPTION OF THE DRAWINGS

FIGS. 2A to 2G are diagrammatic sectional views taken along the line A—A in FIG. 1, illustrating various steps of a first embodiment of the self-aligned contact hole formation method in accordance with the present invention;

DESCRIPTION OF THE PREFERRED EMBODIMENTS

Now, a first embodiment of the present invention will be described with reference to FIGS. 1, 2A to 2G, 3 and 4.

On a p-type silicon substrate 10, an isolating field insulator layer 10 having a thickness of 0.5 μm is formed by LOCOS (local oxidation of silicon) process. In addition, a silicon dioxide layer of 40 nm thickness (not shown) is formed on a surface of the silicon substrate 10 by means of a thermal oxidation process, and a channel doping is performed through the silicon dioxide layer. Thereafter, the silicon dioxide layer of 40 nm thickness is removed by an etching liquid, and a gate insulator layer 14 of 20 nm thickness silicon dioxide is formed by means of the thermal oxidation process.

Figure 1:
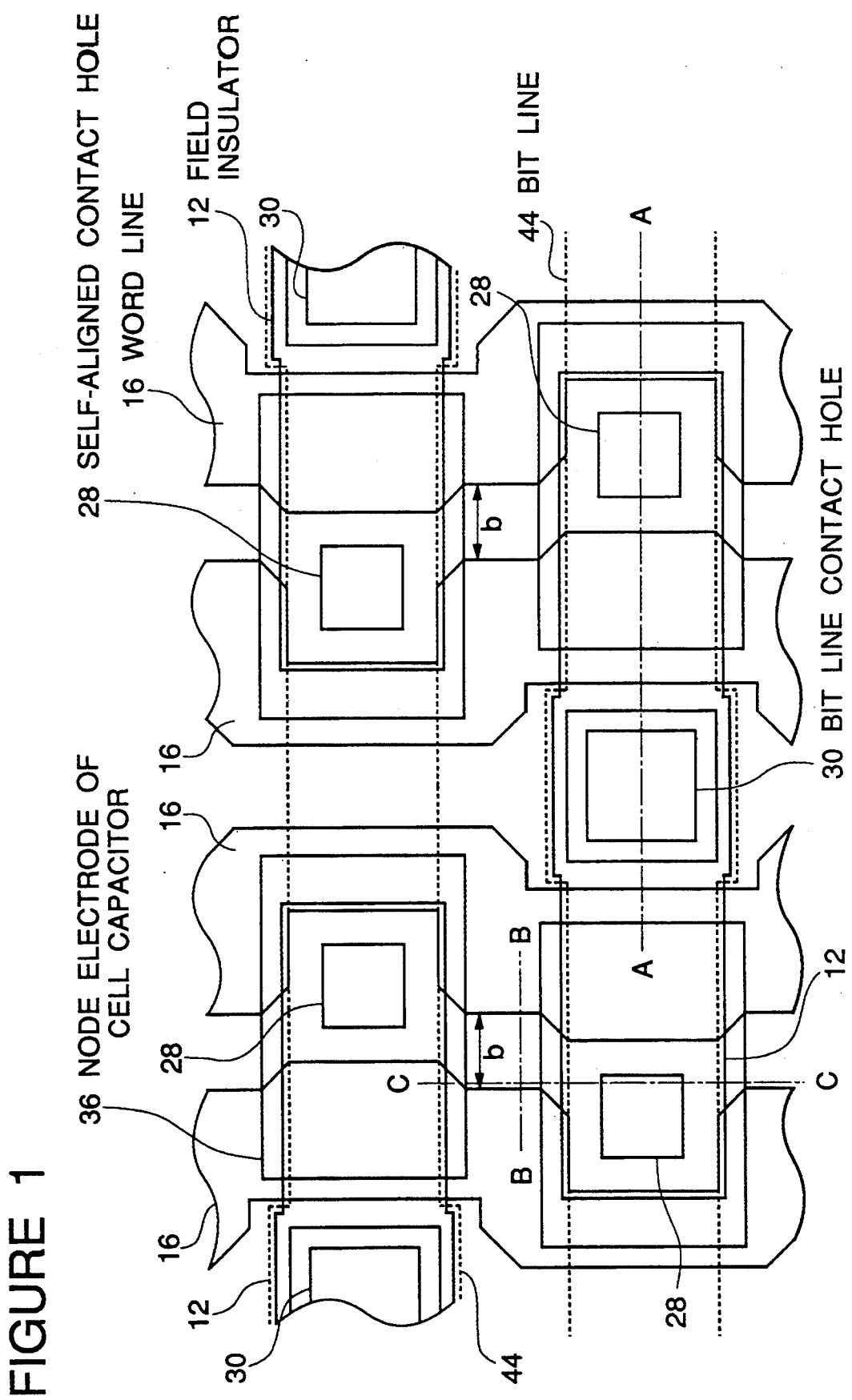
FIG. 1 is a partial layout pattern diagram of a stacked capacitor one-transistor type DRAM manufactured in accordance with the present invention.
Figure 2A:
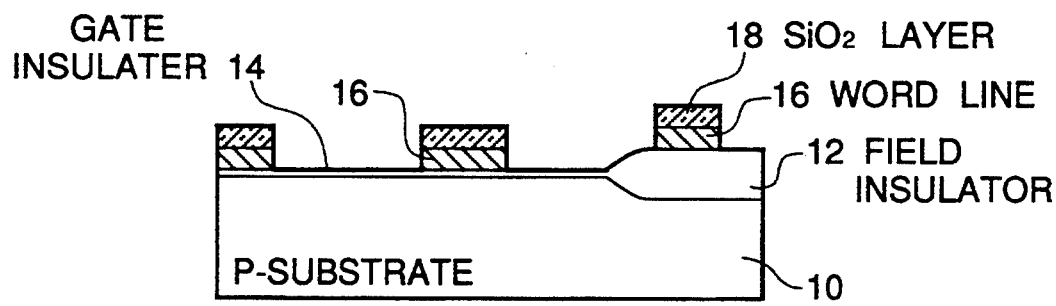

Then, a polysilicon is deposited to form a layer of 0.3 μm thickness by a LPCVD (low pressure chemical vapor deposition) process, and phosphorus is diffused in a vapor thermal diffusion process, so that the deposited polysilicon layer has a sheet resistance of 40 Ω/□. Furthermore, a silicon dioxide is deposited to form a layer of 0.2 μm thickness by the LPCVD process. The stacked double layer consisting of the polysilicon layer of 0.3 μm thickness and the silicon dioxide layer of 0.2 μm thickness is patterned by a photolithographic process, so as to form a word line 16 of polysilicon which has a layout pattern as shown in FIG. 1 and which is covered with a silicon dioxide layer 18, as shown in FIG. 2A.

Figure 2B:
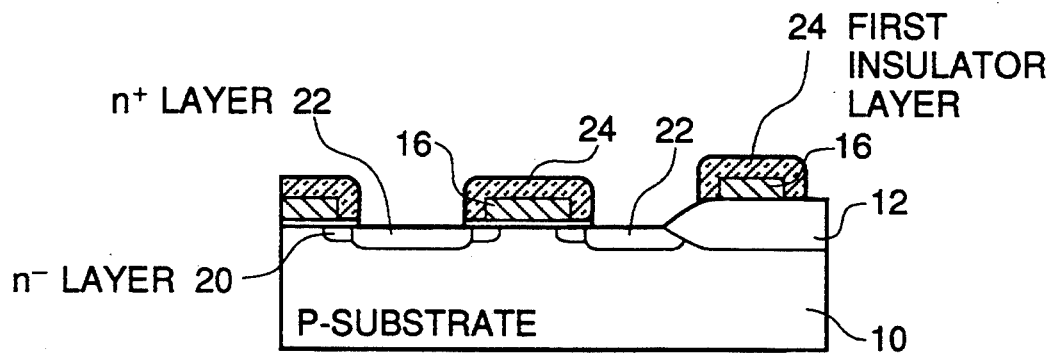

Thereafter, as shown in FIG. 2B, phosphorus is ion-implanted into the surface of the substrate by an ion implantation process so as to form an n− layer 20. Then, a silicon dioxide layer of 0.2 μm thickness (not shown) is formed by the LPCVD process, and the deposited silicon dioxide layer of 0.2 μm thickness is etched back so that the silicon dioxide layer remains on side wall surfaces of the word line 16. Further, arsenic is implanted into the substrate surface by the ion implantation process, and an ion-implanted layer is activated by a heat treatment, so that an n+ layer 22 is formed. Thus, a MOS type field effect transistor of the LDD (lightly doped drain) structure is formed in such a manner that a pair of source/drain regions are formed of a pair of n+ layer regions 22 that are separated by a non-doped region under the gate insulator 14 in FIG. 2B.

In the above mentioned process, the silicon dioxide layer remaining on the side wall surfaces of the word line 16 after the etch-back process and the silicon dioxide layer deposited on the upper surface of the word line 16 in the preceding process cooperate to form a first insulator layer 24 which covers the word line 16.

Figure 2C:
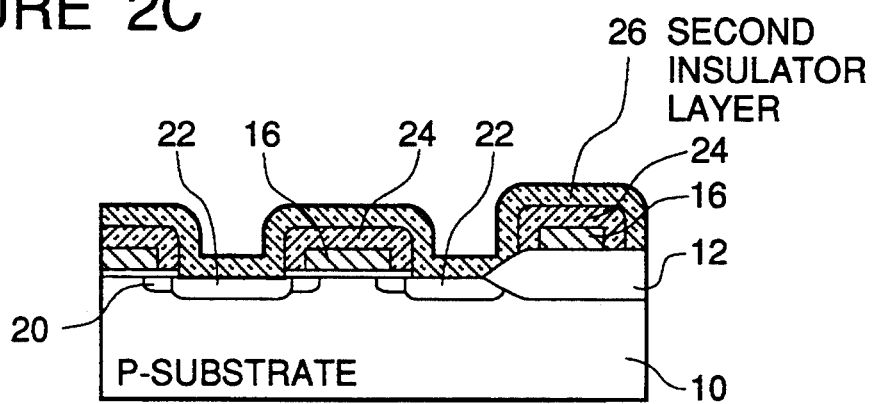

In addition, a silicon dioxide is deposited by the LPCVD process so as to form a second insulator layer 26 which completely cover the first insulator layer 24 and the substrate surface, as shown in FIG. 2C.

This formation of the second insulator layer 26 is the most important step for forming the self-aligned contact holes. In order to obtain a desired effect in the present invention, the following condition needs to be satisfied: Assuming that a spacing between each pair of adjacent word lines 16 in a mask layout pattern is "b" as shown in FIG. 1, and the thickness of the first insulator layer 24 on the side wall surfaces of the word line 16 is $t_1$ and the thickness of the second insulator layer 26 on the side wall surfaces of the word line 16 is $t_2$, the condition of $b < 2(t_1+t_2)$ should be satisfied.

Figure 3:
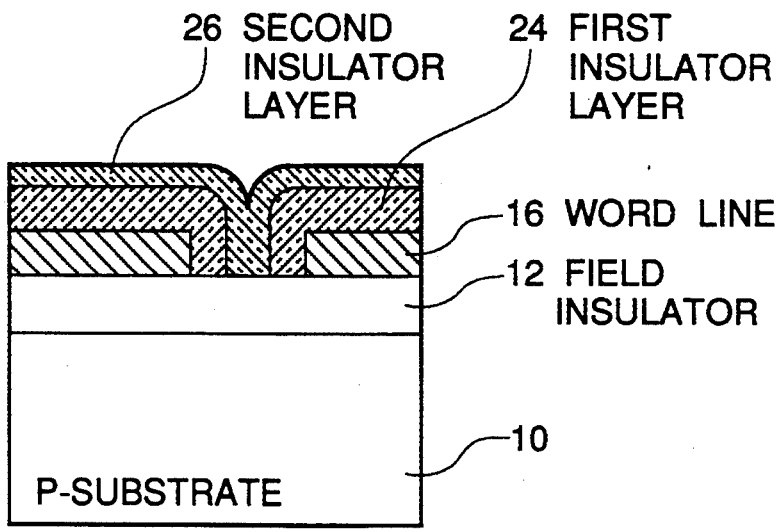
FIG. 3 is a diagrammatic sectional views taken along the line B—B in FIG. 1, illustrating one step of the first embodiment of the self-aligned contact hole formation method illustrated in FIGS. 2A to 2G.
Figure 4:
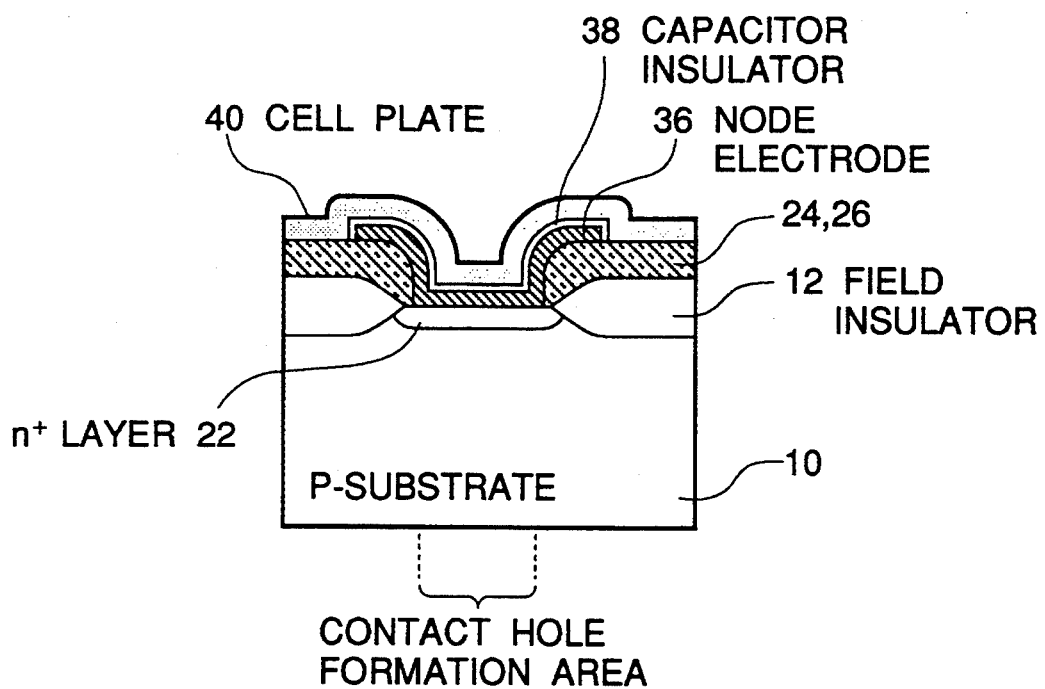
FIG. 4 is a diagrammatic sectional views taken along the line C—C in FIG. 1, illustrating one step of the first embodiment of the self-aligned contact hole formation method illustrated in FIGS. 2A to 2G.

If this condition is satisfied, a space between each pair of adjacent word lines 16 is completely filled with the first and second insulator layers 24 and 26, as shown in FIG. 3 illustrating the sectional view taken along the line B—B in FIG. 1. On the other hand, a formation area of a contact hole 28 in which a node electrode for a cell capacitor is to be contacted to the silicon substrate, is surrounded or confined by the second insulator layer 26, so that the contact hole between the node electrode of the cell capacitor and the silicon substrate can be formed in a self-aligned manner by using only the first and second insulator layers 24 and 26 formed on the upper surface and the side wall surfaces of the word line 16. In the example shown in FIG. 1., in regions other than the formation regions for the self-aligned contact holes 28 and bit line contact holes 30, if the word line 16 is patterned so that the spacing "b" between the word lines has a constant value satisfying the condition of $b < 2(t_1+t_2)$, it is possible to avoid deterioration of flatness or planar structure caused by the self-aligned contact hole formation.

A photoresist 32 is deposited, and then patterned to have an opening 34 at the formation region of the self-aligned contact hole 28. Thereafter, the contact hole 28 for electrical connection between the node electrode of the cell capacitor and the silicon substrate is formed by a reactive ion etching. In a direction of the sectional view shown in FIG. 2D (the line A—A in FIG. 1), this contact hole 28 is formed in the self-aligned manner by utilizing the first and second insulator layers 24 and 26 formed on the side wall surfaces of the word line 16. On the other hand, in a direction orthogonal to the direction of the line A—A, namely in the direction of the line C—C in FIG. 1, the contact hole is formed in the self-aligned manner by utilizing the first and second insulator layers 24 and 26 filling the spaces between the word lines.

As seen from the above, since the contact hole can be formed without utilizing the isolating field insulator layer 12, it is possible to restrain the thickness of the isolating field insulator layer 12, and therefore, to reduce a total height of the step. In addition, since a space between the word lines are filled with the insulator layers 24 and 26, no narrow and deep groove is formed between each pair of adjacent word lines, and therefore, it is possible to perform the photoresist patternings and the etchings in succeeding processes with good working precision.

Here, it should be noted that the pattern of the photoresist is not limited to the pattern shown in FIG. 2D, but it is sufficient if the photoresist covers at least only regions in which the bit line contact hole 30 is to be formed.

After the photoresist 32 is removed, a polysilicon is deposited to form a layer of 0.2 μm thickness by the LPCVD process, and phosphorus is diffused into the deposited polysilicon layer by the vapor thermal diffusion process. The deposited and doped polysilicon layer is patterned by the photolithographic process so as to form a node electrode 36 of the cell capacitor, as shown in FIG. 2E. This node electrode 36 thus formed is in contact with the n+ layer region 22 (drain) through the contact hole 28. Then, a silicon dioxide layer of 2 nm thickness, a silicon nitride layer of 7 nm thickness and a silicon dioxide layer of 2 nm thickness are sequentially deposited in the named order by the LPCVD process, and the deposited three-layer insulator is patterned by a photolithographic process, so as to form an insulator layer 38 of the cell capacitor. In addition, a polysilicon is deposited to form a layer of 0.2 μm thickness by the LPCVD process, and phosphorus is diffused in the vapor thermal diffusion process so that the deposited polysilicon layer his a sheet resistance of 50 Ω/□. The deposited polysilicon layer is further patterned so as to form a cell plate 40 of the cell capacitor.

Next, BPSG is deposited by the LPCVD process so as to form a layer of 0.5 μm, and then, is caused to flow in a heating treatment, so that a third insulator layer 42 having a planar surface is formed, as shown in FIG. 2F. Then, the bit line contact hole 30 is formed by the photolithographic process, and a refractory metal silicide is deposited by a sputtering so as to form a layer of 0.2 μm. Furthermore, phosphorus is implanted by the ion implantation, and the deposited and doped refractory metal silicide layer is patterned to form a bit line 44. The bit line 44 thus formed is in contact with the n+ layer region 22 (source) through the contact hole 30.

Figure 2G:
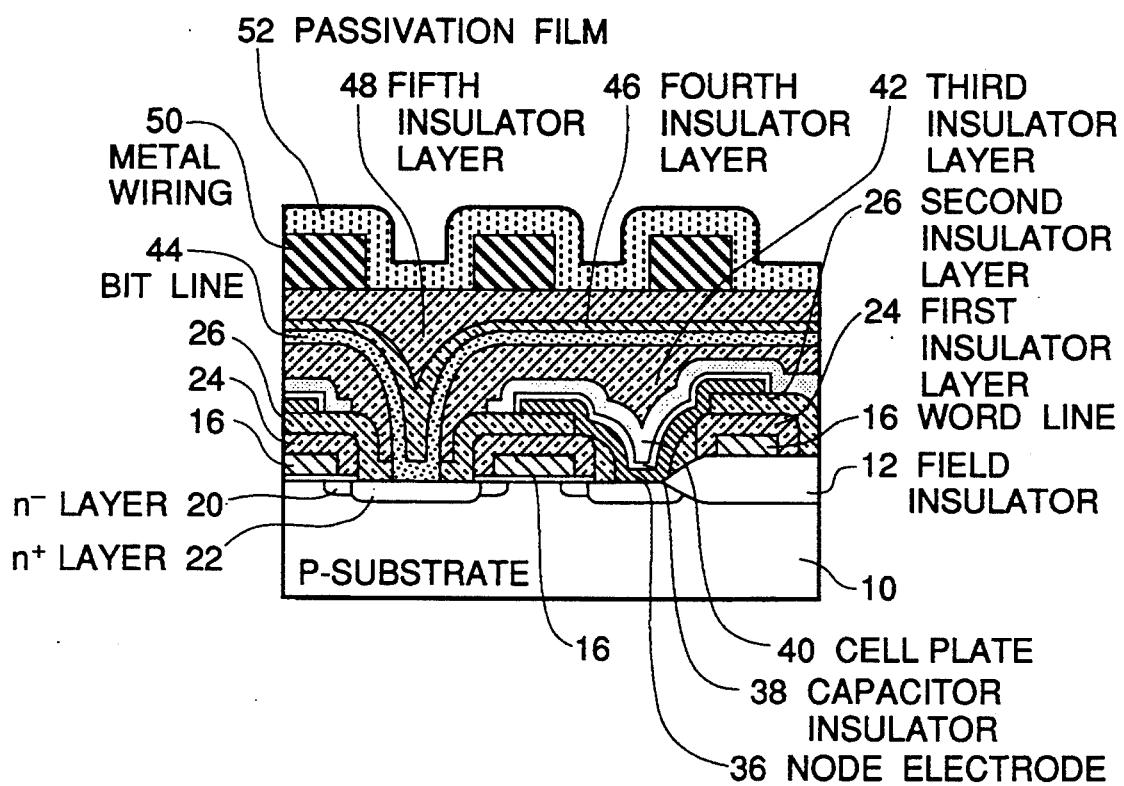

Thereafter, as shown in FIG. 2G, a fourth insulator layer 46 and a fifth insulator layer 48 are sequentially deposited in the named order, and then, a metal wiring layer 50 is formed by depositing Al-Si-Cu by sputtering and by patterning the deposited Al-Si-Cu layer. Furthermore, a passivation film 52 is formed. With this, DRAM cells are formed.

The first embodiment mentioned above has the structure in which the word line 16 (conductor layer) is positioned at a level between the n+ layer 22 (conductor layer) and the node electrode 36 (conductor layer) of the cell capacitor and is characterized in that the contact hole for electrically connecting between the n+ layer 22 and the node electrode 36 of the cell capacitor is surrounded by the insulator layers 24 and 26 which cover the word line 16, and formed in the self-aligned manner by utilizing the insulator layers 24 and 26.

Figure 5:
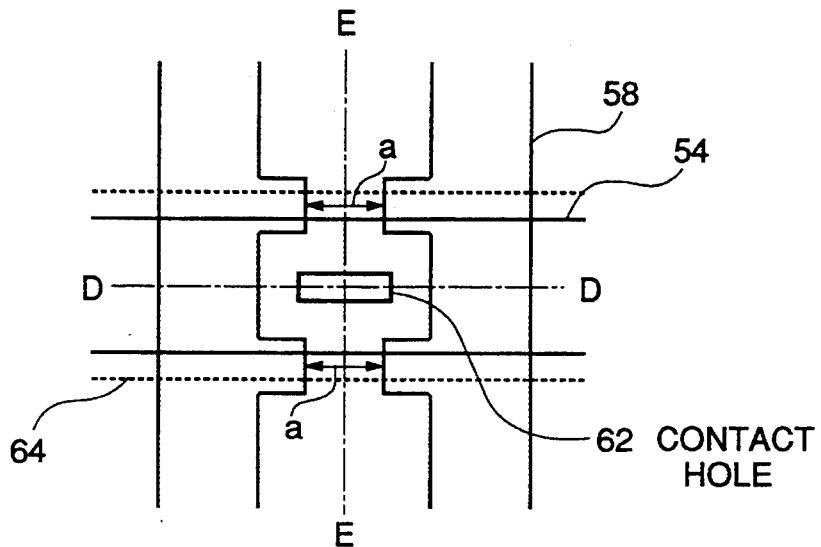
FIG. 5 is a partial layout pattern diagram of another embodiment of the self-aligned contact hole manufactured in accordance with the present invention.
Figure 6:
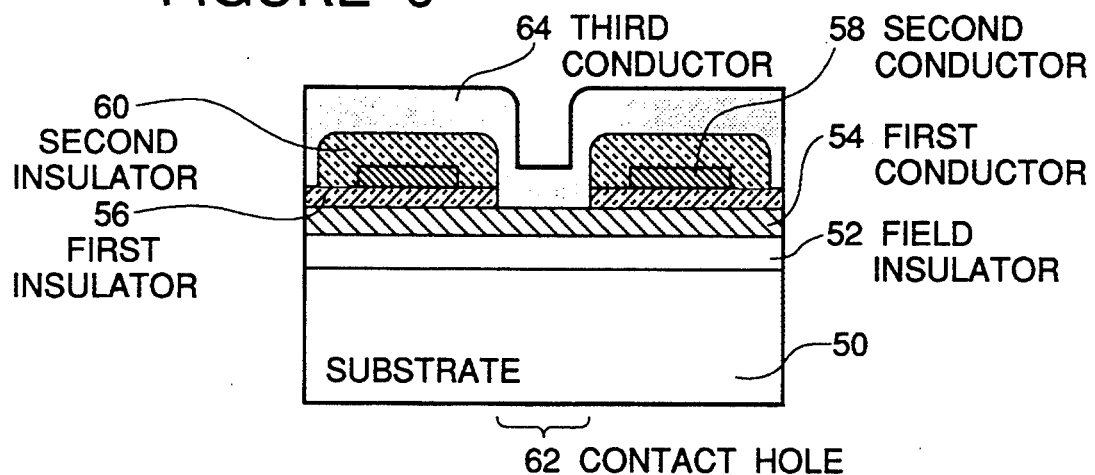
FIG. 6 is a diagrammatic sectional views taken along the line D—D in FIG. 5.
Figure 7:
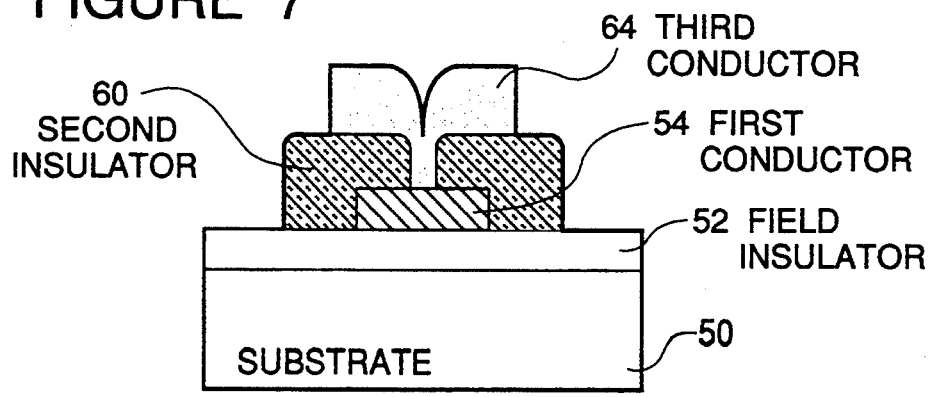
FIG. 7 is a diagrammatic sectional views taken along the line E—E in FIG. 5.

Now, a second embodiment of the present invention will be described with reference to FIGS. 5, 6 and 7. FIG. 5 is a partial layout pattern diagram of another embodiment of the self-aligned contact hole manufactured in accordance with the present invention, and FIGS. 6 and 7 are diagrammatic sectional views taken along the line D—D and along the line E—E in FIG. 5, respectively.

On a silicon substrate 50, an isolating field insulator layer 52 having a thickness of 0.5 μm is formed, and a polysilicon is deposited to form a layer of 0.3 μm thickness by the LPCVD and phosphorus is diffused in the vapor thermal diffusion process, so that the deposited polysilicon layer has a sheet resistance of 40 Ω/□. Furthermore, the polysilicon layer is patterned by the photolithographic process, so as to form a first level conductor layer 54 having a predetermined shape.

A silicon dioxide is deposited by the CVD process so as to form a tint insulator layer 56 of 0.3 μm thickness, and a refractory metal silicide is deposited by a sputtering to form a second level conductor layer 58 of 0.2 μm. Furthermore, the silicon dioxide is deposited by the CVD process so as to form a layer of 0.2 μm thickness. Thereafter, the silicon dioxide layers and the refractory metal silicide layer are patterned into a predetermined shape by the photolithographic process. In addition, a silicon dioxide is deposited by the LPCVD process so as to form a second insulator layer 60 of 0.3 μm thickness.

Here, it is required that a region in which a contact hole 62 for connecting between the first level conductor 54 and a possible third level conductor 62 is surrounded by the second insulator layer 60 which covers the second level conductor 58. For this purpose, a portion designated by "a" in FIG. 5 is completely filled with the second insulator layer 60. If a distance between a pair of adjacent second level conductors 58 is large, a plan view pattern of the second level conductor layer 58 in proximity of the contact hole formation ares is contrived so that, for example as shown in FIG. 5, the pair of adjacent second level conductors 58 partially project toward each other and a distance between the projected portions of the pair of adjacent second level conductors 58 becomes sufficiently short to be completely filled with the second insulator layer Thereafter, the second insulator layer 60 is etched back, and then, an Al-Si-Cu layer of 1.0 μm thickness is deposited by the sputtering, and patterned to a predetermined shape. As a result, a third level conductor layer 64 electrically connected to the first level conductor layer 54 through the contact hole 62 is formed.

The first embodiment shows that the present invention can be applied to the formation of the contact hole for electrically connecting between the silicon substrate and the upper level conductor layer in the stacked capacitor type DRAM cell. However, the present invention can form an interlayer connection contact hole in a self-aligned manner, by utilizing an insulator layer for an intermediate level conductor if conductor layers of three or more different levels are provided, as seen from the second embodiment.

As seen from the above, in the semiconductor devices having conductors of three or more different levels, the present invention can be applied to formation of self-aligned contact holes for electrically connecting a first level conductor and a third level conductor positioned at a level higher than the first level conductor by two or more levels. According to the present invention, the self-aligned contact holes are formed by utilizing an insulator layer on an upper surface and side surfaces of a second level conductor positioned at a level between the first and third level conductors. Therefore, it is possible to thin out the isolating field insulator, and therefore, to minimize a step formed on the underlying layers. Accordingly, the self-aligned contact holes can formed without decreasing the working precision of the photoresist patterning and the etching in the succeeding processes. In addition, since the element required for formation of the self-aligned contact holes in accordance with the present invention is only the intermediate level conductor layer, it is possible to form the self-aligned contact holes by utilizing conductor layers of arbitrary three different levels in combination.

The invention has thus been shown and described with reference to the specific embodiments. However, it should be noted that the present invention is in no way limited to the details of the illustrated structures but changes and modifications may be made within the scope of the appended claims.

I claim:

1. A method of forming a semiconductor device, the method comprising the steps of:

selectively forming a field insulator layer on a principal surface of a semiconductor substrate, so as to partition at least one device formation region surrounded by said field insulator layer;

forming a first conductive layer pattern which extends over said field insulator layer to cross over said device formation region interposing a first insulator layer between said device formation region and said first conductive layer pattern, and a second conductive layer pattern which extends in parallel with and apart from said first conductive layer pattern in a layout plan view and which also extends along a periphery of said device formation region without overlapping said device formation region;

forming a second insulator layer covering over said first and second conductive layer patterns, said field insulator layer, and said device formation region so as to fill a space between said first and second conductive layer patterns; and etching back said second insulator layer so as to expose a portion of said device formation region, so that a contact hole surrounded by said second insulator layer is formed on the exposed portion of said device formation region, said surrounding second insulating layer remaining in a self-aligned manner at a side of said first and second conductive layer patterns.

2. A method claimed in claim 1 wherein said second insulator layer is composed of a first insulator film covering said first and second conductive layer patterns and a second insulator film covering said first insulator film, a thickness $t_1$ of said first insulator film and a thickness $t_2$ of said second insulator film on side wall surfaces of said first and second conductive layer patterns being:

$$b < 2(t_1 + t_2)$$

where "b" is the spacing between said first and second conductive layer patterns in a region other than an area in which said contact hole is to be formed.

3. A method of forming a semiconductor device, the method comprising the steps of:

selectively forming a field insulator layer on a principal surface of a semiconductor substrate, so as to partition at least first and second device formation regions surrounded by said field insulator layer;

forming a first conductive layer pattern which extends over said field insulator layer to cross over said first device formation region interposing a first insulator layer between said first device formation region and said first conductive layer pattern and also extends along a periphery of said second device formation region without overlapping said second device formation region; and a second conductive layer pattern extending in parallel with and apart from said first conductive layer pattern in a layout plan view, and extending over said field insulator layer to cross over said second device formation region for interposing said first insulator layer between said second device formation region and said second conductive layer pattern, and also extending along a periphery of said first device formation region without overlapping said first device formation region;

forming a second insulator layer covering over said first and second conductive layer patterns, said field insulator layer and said first and second device formation regions filling a space between said first and second conductive layer patterns; said second insulator layer having a thickness which larger than a half of a distance between opposing peripheries of said first and second conductive layer patterns; and etching back said second insulator layer to expose a portion of each of said first and second device formation regions to form a contact hole surrounded by said second insulator layer on the exposed portion of each of said first and second device formation regions, said surrounding second insulator layer remaining in a self-aligned manner at a side of said first and second conductive layer patterns.

4. A method claimed in claim 3 wherein said second insulator layer is composed of a first insulator film covering said first and second conductive layer patterns and a second insulator film covering said first insulator film, a thickness $t_1$ of said first insulator film and a thickness $t_2$ of said second insulator film on side wall surfaces of said first and second conductive layer patterns being:

$$b < 2(t_1 + t_2)$$

where "b" is the spacing between said first and second conductive layer patterns in a region other than an area in which said contact hole is to be formed.

5. A method for forming a semiconductor device, the method comprising the steps of:

forming a first insulator layer covering on a principal surface of a semiconductor substrate;

forming a first conductive layer pattern on said first field insulator layer;

forming a second insulator layer covering said first conductive layer pattern and said first insulator layer;

forming second and third conductive layer patterns on said second insulator layer to extend in parallel with each other and to cross over said first conductive layer pattern in a layout plan view, each one of said second and third conductive layer patterns having a projection which extends along and on each side of said first conductive layer pattern and also opposes a projection extending from the other of said second and third conductive layer patterns;

forming a third insulator layer covering over said second and third conductive layer patterns and said second field insulator layer so as to fill a space between said second and third conductive layer patterns, said third insulator layer having a thickness which is larger than a half of a distance between the opposing projections of said second and third conductive layer patterns; and etching back said second and third insulator layers so as to expose a portion of said first conductive layer pattern to form a contact hole surrounded by the remaining second and third insulator layers in a self-aligned manner on the exposed portion of said first conductive layer pattern.

* * * * *